United States Patent

[11] 3,588,713

[72] Inventor Michael J. Yareck
Staten Island, N.Y.
[21] Appl. No 757,237
[22] Filed Sept. 4, 1968
[45] Patented June 28, 1971
[73] Assignee The Bendix Corporation

[54] MULTIPLIER CIRCUIT
7 Claims, 5 Drawing Figs.

[52] U.S. Cl. 328/160, 307/229, 307/251, 328/127, 235/194
[51] Int. Cl. G06g 7/16
[50] Field of Search 328/160; 307/229; 235/194

[56] References Cited

UNITED STATES PATENTS 2,842,664 7/1958 Martin 328/160
3,368,066 2/1968 Miller et al 328/160
3,466,460 9/1969 Connolly 328/160
3,473,043 10/1969 James 328/160

*Primary Examiner*—Donald D. Forrer
*Assistant Examiner*—Harold A. Dixon
*Attorneys*—Anthony F Cuoco and Plante, Arens, Hartz and O'Brien

ABSTRACT: A multiplier including operational amplifiers for providing an oscillator which generates an output having a sawtooth waveform with a duty cycle proportional to a first input signal. A switch controlled by the sawtooth output gates a second input signal with the same duty cycle providing a pulse having an amplitude corresponding to the second input signal and a duty cycle proportional to the first input signal. The switch output is filtered for providing a signal proportional to the product of the first and second input signals.

INVENTOR.
MICHAEL J. YARECK

BY Anthony F. Cusco
ATTORNEY

INVENTOR.
MICHAEL J. YARECK

BY Anthony J. [signature]
ATTORNEY

MULTIPLIER CIRCUIT

BACKGROUND OF THE INVENTION

1. Field of the Invention

This invention relates to multiplier circuits and, more particularly, to multiplier circuits having increased accuracy, linearity and stability.

2. Description of the Prior Art

When dealing with computing or control systems, it is often necessary to multiply one signal by another. If the system is, for example, a sophisticated flight control system, accuracy is a paramount consideration.

Heretofore, multiplier circuits employing logarithmic or square law devices using nonlinear elements have not achieved the required accuracy. Digital techniques have been used but are undesirable because of circuit complexity.

SUMMARY OF THE INVENTION

This invention contemplates a multiplier circuit including a comparator, an integrator, a voltage controlled switch and a filter. The comparator senses the integrator output and activates the switch as a function thereof. The switch sums a predetermined reference voltage into the integrator driving the integrator output in the reverse direction and closing a loop that provides a free running oscillator generating a sawtooth output having a waveform proportional to a first input signal. The switch is responsive to the sawtooth output for gating a second input signal with the same duty cycle providing a pulse with an amplitude corresponding to the second input signal and a duty cycle proportional to the first input signal. The filter filters the pulse for providing an output which is the average value of the pulse and therefore proportional to the product of the two input signals.

One object of this invention is to provide a multiplier circuit having increased accuracy, linearity and stability.

Another object of this invention is to employ the inherent characteristics of operational amplifiers for providing a multiplier with simplified circuitry.

Another object of this invention is to provide means for generating a sawtooth output as a function of a first input signal and means controlled by the sawtooth output for gating a second input signal to provide a pulse as a function of the first and second input signals.

Another object of this invention is to combine in a single closed loop system means for generating a sawtooth output to provide a reference and means for comparing an input signal to the reference to provide pulse width modulation.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
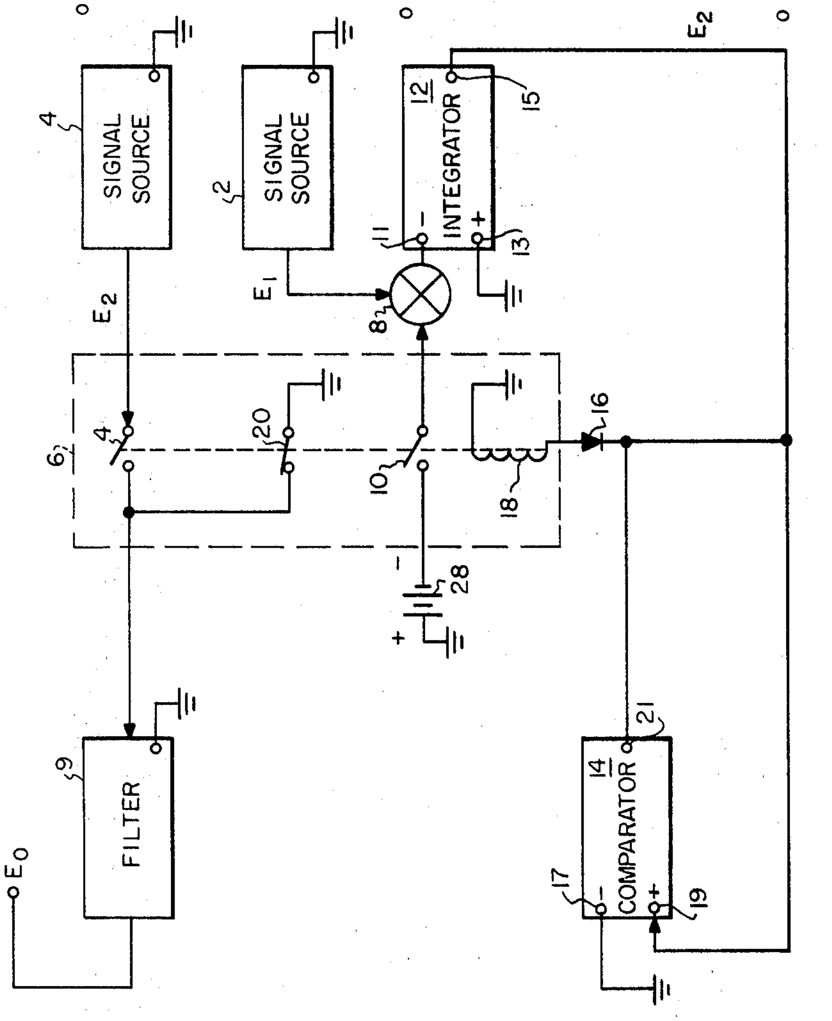
FIG. 1 is a block diagram of the multiplier of the present invention.

With reference to FIG. 1, a signal source 2 provides a signal $E_1$ and a signal source 4 provides a signal $E_2$. Signals $E_1$ and $E_2$ may correspond, for purposes of example, to flight condition signals and it is desired to provide a signal corresponding to the product of signals $E_1$ and $E_2$ for use in a flight control system.

Signal $E_2$ from signal source 4 is applied to a normally open contact 4 of a switching device 6 and signal $E_1$ from signal source 2 is applied to a summing means 8. A source of negative direct current such as a battery 28 is connected to a normally open contact 10 of switching device 6, and which normally open contact 10 is connected to summing means 8.

An integrator 12 has an inverting input 11 connected to summing means 8, a grounded noninverting input 13 and an output 15. The output from integrator 12 at output 15 is applied to a noninverting input 19 of a comparator 14, and which comparator 14 has a grounded inverting input 17 and an output 21. Comparator 14 compares the polarity of the output from integrator 12 to ground and provides an output signal in accordance therewith which is applied through a diode 16 to a relay 18 included in switching device 6. When relay 18 is energized by the output of comparator 14 as will hereinafter be explained, normally open contacts 4 and 10 of switching device 6 are closed and a grounded normally closed contact 20 of switching device 6 is opened.

When contact 10 of switching device 6 is closed, the negative voltage from battery 28 and signal $E_1$ from signal source 2 are summed by summing means 8 and the summation signal therefrom is applied to inverting input 11 of integrator 12. The output of integrator 12 is driven in the reverse direction and a loop is closed that forms a free running oscillator for providing at output terminal 15 of integrator 12 a sawtooth output having a waveform as shown in the graphical representation of FIG. 4. As will hereinafter be shown, the duty cycle of the sawtooth waveform of FIG. 4 is linearly proportional to signal $E_1$ from signal source 2. The sawtooth output from integrator 12 is applied to comparator 14 and comparator 14 compares the polarity of this output to ground as heretofore noted providing a pulse having a waveform as shown in the graphical representation of FIG. 3 for operating relay 18 to open and close switch contacts 4, 10 and 20 to gate signal $E_2$ from signal source 4.

Figure 5:
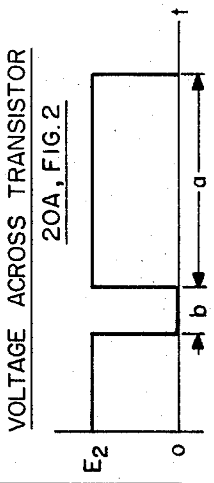
FIG. 5 is a graphical representation of a pulse output from a switching device 6 shown in FIGS. 1 and 2 and provided in accordance with the invention.

When contact 4 of switching device 6 is closed by relay 18, voltage $E_2$ from signal source 4 is gated with the same duty cycle as the sawtooth output so that the output of switching device 6 is a pulse having a waveform as shown in the graphical representation of FIG. 5. This pulse has an amplitude $E_2$ and duty cycle proportional to signal $E_1$. The pulse is applied to filter 9 for providing an output $E_o$ which is the average value of the pulse and therefore proportional to the product of $E_1$ and $E_2$ as will be analytically shown.

Figure 2:
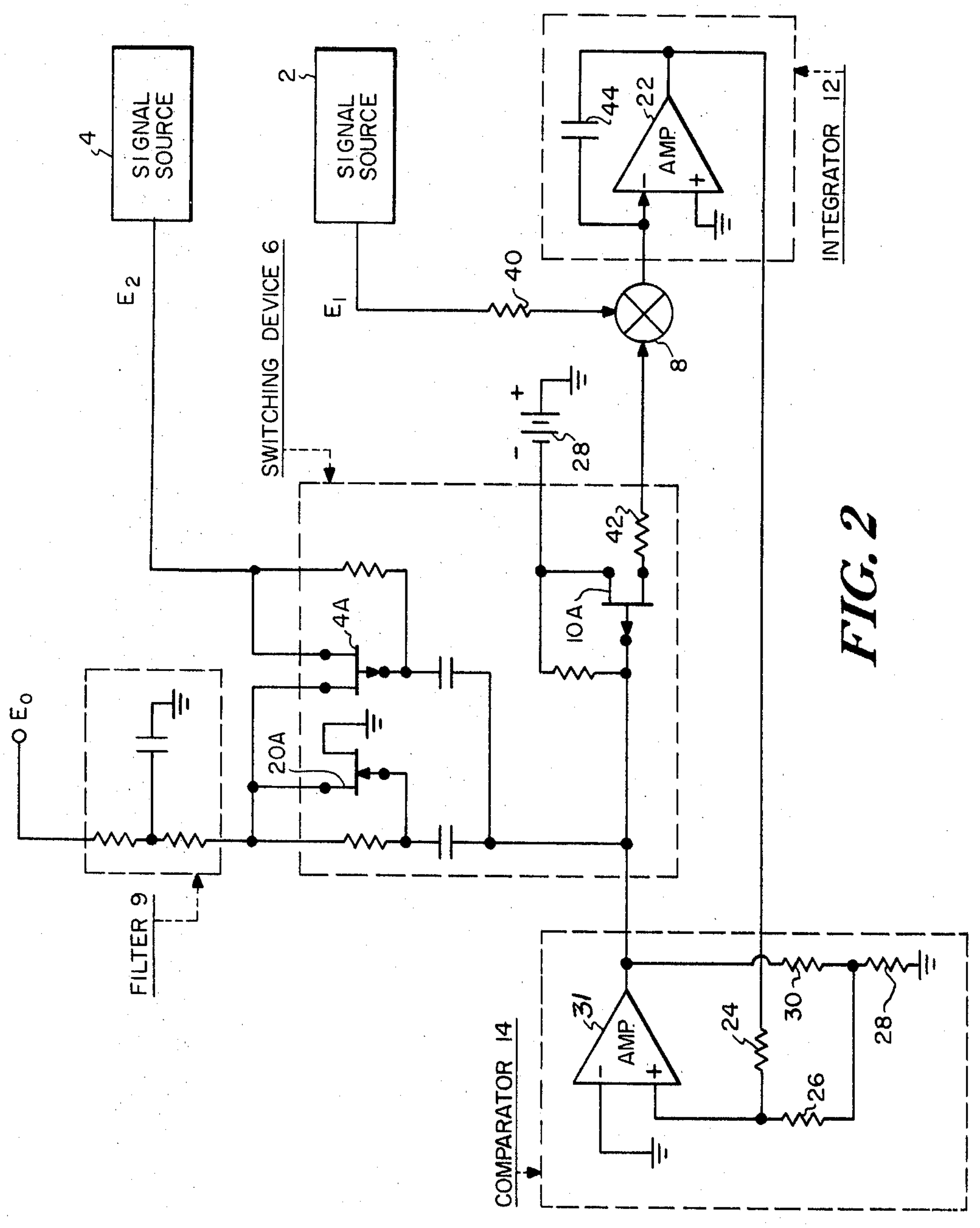
FIG. 2 is an electrical schematic diagram showing in substantial detail the elements of the invention designated generally in the block diagram of FIG. 1.

With reference to FIG. 2, switching device 6, filter 9, integrator 12, and comparator 14 are shown in substantial detail and switch contacts 4, 10 and 20 of switching device 6 are represented as field effect transistors 4A, 10A and 20A, respectively.

Figure 3:
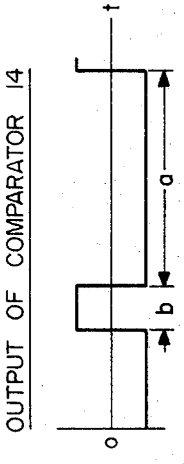
FIG. 3 is a graphical representation showing the waveform of an output from a comparator 14 shown in FIGS. 1 and 2 and provided in accordance with the invention.
Figure 4:
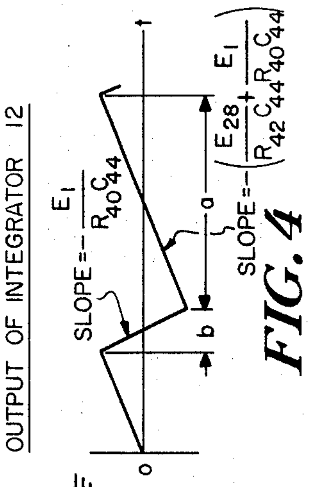
FIG. 4 is a graphical representation of a sawtooth output from an integrator 12 shown in FIGS. 1 and 2 and provided in accordance with the present invention.

Thus, the output of an operational amplifier 31 in comparator 14, and which output has the waveform shown in FIG. 3, reverses polarity when the output of an operational amplifier 22 in integrator 12, and which output has the sawtooth waveform shown in FIG. 4, exceeds the hysteresis level of amplifier 31. The hysteresis level corresponds to the saturation voltage of amplifier 31 multiplied by the ratio of resistors 24, 26, 28 and 30 in the positive feedback path of amplifier 31. Designating the saturation voltage of amplifier 31 as $A_1$, the hysteresis H may be expressed as follows:

$$H=\pm A_1\left(\frac{R_{28}}{R_{30}+R_{28}}\right)\left(\frac{R_{24}}{R_{26}+R_{24}}\right) \quad (1)$$

Designating the output of amplifier 22 as $A_2$, amplifier 31 switches so that its output reverses polarity when the output of amplifier 22 multiplied by the ratio of resistors $R_{24}$ and $R_{26}$ equals the hysteresis of amplifier 22 as follows $$1\left(\frac{R_{\cdot\cdot}}{R_{\cdot}\quad R_{24}}\right) = \pm H \qquad (2)$$

When the output of amplifier 31 is positive, transistor 10A is cut off, transistor 20A is conductive and transistor 4A is cut off, and amplifier 22 is driven to negative saturation. In this connection it is noted that signal $E_1$ from signal source 2 is restricted to positive voltages unless a bias is summed into integrator 12 as is obvious to one skilled in the art.

When the output of amplifier 22 reaches the hysteresis level of amplifier 31 as represented by equation (1), the output of amplifier 31 reverses polarity thus rendering transistors 10A and 4A conductive and transistor 20A is cut off. Integrator 12 is then driven by the summation of the negative voltage from battery 28 and signal $E_1$ from signal source 2. Transistor 20A is thus alternately rendered conductive and nonconductive by the switching of amplifiers 31 and 22 so that the output of switching device 6 across transistor 20A has a waveform as shown in FIG. 5.

The output $E_0$ of filter 9 is the average value of the voltage across transistor 20A and is equal to the product of the amplitude of signal $E_1$ from signal source 2 and the duty cycle of the waveforms shown in the graphical illustrations of FIGS. 3, 4 and 5. This relationship is expressed as follows:

$$E_0 = E_1\left(\frac{a}{a+b}\right) \qquad (3)$$

If the duty cycle $\left(\frac{a}{a+b}\right)$ is expressed in terms of the slope of the sawtooth waveform of FIG. 4, and which slope is a function of resistors 40 and 42, capacitor 44 and the voltage from battery 28, it is seen that $E_0$ is proportional to the product of signals $E_1$ and $E_2$ and may be expressed as follows:

$$E_0 = KE_1E_2 \qquad (4)$$

where K is the proportionality factor.

It is to be noted that the range of voltages $E_1$ for which the multiplier circuit of the present invention remains in its active region is a function of the relative scaling of resistor 40 connecting signal source 2 to summing means 8 and of resistor 42 connecting transistor 10A to summing means 8. The limits of operation of the device occur when the slopes of the sawtooth waveform shown in the graphical illustration of FIG. 4 equal zero.

From the foregoing description of the invention it may be seen that a sawtooth oscillator is provided to supply a reference and means are included for comparing an input signal ($E_2$) against this reference to provide pulse width modulation. The sawtooth oscillator and the modulating means are combined in a simple closed loop system. Moreover, it may be seen that switch 6 is implemented with simplicity since it is responsive to the polarity of the output from integrator 12.

In practice no adjustments are required to maintain accuracy of better than ±5 percent over the temperature range minus 55° centigrade to 100° centigrade. Moreover, the proportionality factor K and the allowable range of input voltages $E_1$ and $E_2$ can be changed over a wide range with a minimum change of circuit components.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

I claim:

1. A multiplier circuit comprising:
means for providing a first signal;
means for providing a second signal;
means for providing a reference signal;
an integrator for integrating the first signal and for providing an output in one sense;
a comparator for comparing the integrator output to a predetermined voltage level and for providing a signal in accordance with said comparison,
a normally open first switch connected to the integrator, the reference signal means and the comparator and responsive to the comparator signal for being closed to sum the reference signal into the integrator whereupon the integrator is driven in an opposite sense and provides a signal having a waveform corresponding to the first signal;
a normally open second switch connected to the second signal means and to the comparator for being closed in response to the comparator signal;
a normally closed third switch connected to ground and to the comparator and opened in response to the comparator signal; and
means connected to the second and third switches and responsive to a signal provided by the closing of the second switch and the opening of the third switch for providing an output signal corresponding to the product of the first and second signals.

2. A multiplier circuit as described by claim 1, wherein the comparator includes:
an amplifier having a grounded inverting input terminal, a noninverting input terminal and an output terminal;
a first resistor for connecting the noninverting input terminal to the integrator so that the amplifier compares the integrator output to ground and provides an output in the one sense when the integrator output is in the one sense;
a second resistor connected to the output and connected to a grounded third resistor;
a fourth resistor connected intermediate the second and third resistors and connected to the noninverting input terminal; and
the amplifier providing an output in the opposite sense when the integrator output exceeds the hysteresis level of the amplifier, said hysteresis level being a function of the first, second, third and fourth resistors.

3. A multiplier circuit as described by claim 1 wherein:
the waveform corresponding to the first signal provided by the integrator is a sawtooth waveform having a duty cycle proportional to the first signal.

4. A multiplier circuit as described by claim 1, wherein a pulse is provided by closing the second switch and opening the third switch and the circuit further includes:
a filter for providing an output corresponding to the average value of the pulse and proportional to the product of the first and second signals.

5. A multiplier circuit as described by claim 4, wherein:
the pulse provided by closing the second switch and opening the third switch has an amplitude corresponding to the second signal and a duty cycle corresponding to the first signal.

6. A multiplier circuit as described by claim 9, wherein the integrator comprises:
an amplifier having a grounded noninverting input terminal, an inverting input terminal connected to the first switch and to the means for providing a first signal, and an output terminal;
a feedback capacitor connected to the output terminal and to the inverting input terminal; and
said capacitor being responsive to the first signal for affecting the amplifier so that there is provided at the output terminal thereof the output in the one sense, and responsive to the first signal and the reference signal when the reference signal is summed into the integrator for affecting the amplifier so that there is provided at the output terminal thereof the output in the opposite sense whereby the amplifier provides the signal having a waveform corresponding to the first signal.

7. A multiplier circuit as described by claim 6, including:

a first resistor for connecting the means for providing a first signal to the inverting input terminal of the integrator amplifier;

a second resistor for connecting the first switch to the inverting input terminal of the integrator amplifier; and the integrator amplifier output in the one sense increasing linearly in the one sense as a function of the first signal, the feedback capacitor and the first resistor, and the integrator amplifier output in the other sense increasing linearly in the other sense as a function of the first signal, the feedback capacitor, the reference signal and the first and second resistors.